US010090406B2

(12) United States Patent
Prechtl et al.

(10) Patent No.: US 10,090,406 B2
(45) Date of Patent: Oct. 2, 2018

(54) NON-PLANAR NORMALLY OFF COMPOUND SEMICONDUCTOR DEVICE

(71) Applicant: Infineon Technologies Austria AG, Villach (AT)

(72) Inventors: Gerhard Prechtl, Rosegg (AT); Clemens Ostermaier, Villach (AT); Oliver Haeberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 481 days.

(21) Appl. No.: 14/489,628

(22) Filed: Sep. 18, 2014

(65) Prior Publication Data
US 2016/0087089 A1 Mar. 24, 2016

(51) Int. Cl.
*H01L 29/66* (2006.01)
*H01L 29/15* (2006.01)
(Continued)

(52) U.S. Cl.
CPC ...... *H01L 29/7787* (2013.01); *H01L 29/0657* (2013.01); *H01L 29/0688* (2013.01); *H01L 29/205* (2013.01); *H01L 29/41725* (2013.01); *H01L 29/42356* (2013.01); *H01L 29/66462* (2013.01); *H01L 29/7786* (2013.01); *H01L 29/7789* (2013.01); *H01L 23/3171* (2013.01);
(Continued)

(58) Field of Classification Search
CPC ............. H01L 29/0657; H01L 29/7385; H01L 29/517; H01L 29/1209; H01L 29/66462; H01L 29/2003; H01L 29/7787; H01L 29/66431

USPC ......... 257/192, 194, 76, 330, 365, E21.403, 257/E29.255; 438/478, 172
See application file for complete search history.

(56) References Cited

U.S. PATENT DOCUMENTS 5,929,467 A * 7/1999 Kawai et al. ................. 257/192
7,417,267 B2 8/2008 Beach
(Continued)

FOREIGN PATENT DOCUMENTS

CN 102856366 A 1/2013
CN 103579329 A 2/2014
(Continued)

*Primary Examiner* — Dzung Tran
(74) *Attorney, Agent, or Firm* — Murphy, Bilak & Homiller, PLLC

(57) ABSTRACT

A normally-off compound semiconductor device includes a first III-nitride semiconductor having a first sloped transition region in which the first III-nitride semiconductor transitions at an angle from a first level to a second level different than the first level, and a second III-nitride semiconductor on the first III-nitride semiconductor and having a different band gap than the first III-nitride semiconductor so that a two-dimensional charge carrier gas arises along an interface between the first and second III-nitride semiconductors. The normally-off compound semiconductor device further includes a gate on the second III-nitride semiconductor and a doped semiconductor over the first sloped transition region and interposed between the gate and the second III-nitride semiconductor. The two-dimensional charge carrier gas is disrupted along the first sloped transition region due solely to the slope of the first sloped transition region if steep enough, or also due to the presence of the doped semiconductor.

20 Claims, 18 Drawing Sheets

(51) Int. Cl.
*H01L 29/778* (2006.01)
*H01L 29/06* (2006.01)
*H01L 29/205* (2006.01)
*H01L 29/417* (2006.01)
*H01L 29/423* (2006.01)
H01L 23/31 (2006.01)
H01L 29/20 (2006.01)
H01L 29/10 (2006.01)

(52) U.S. Cl.
CPC ...... *H01L 29/1066* (2013.01); *H01L 29/2003* (2013.01); *H01L 29/42316* (2013.01); *H01L 2924/0002* (2013.01)

(56) References Cited

U.S. PATENT DOCUMENTS

| | | | |
|---|---|---|---|
| 2005/0145883 A1* | 7/2005 | Beach et al. | 257/194 |
| 2007/0069240 A1* | 3/2007 | Passlack | 257/192 |
| 2008/0087915 A1* | 4/2008 | Uemoto | H01L 29/1066 257/192 |
| 2009/0121775 A1* | 5/2009 | Ueda et al. | 327/427 |
| 2009/0278172 A1* | 11/2009 | Kaya et al. | 257/192 |
| 2014/0264450 A1* | 9/2014 | Chyi et al. | 257/194 |

FOREIGN PATENT DOCUMENTS

| | | | |
|---|---|---|---|
| DE | 102011000911 A1 | 9/2011 | |
| JP | 2009099774 A | 5/2009 | |

\* cited by examiner

NON-PLANAR NORMALLY OFF COMPOUND SEMICONDUCTOR DEVICE

TECHNICAL FIELD

The present application relates to compound semiconductor devices, in particular normally off compound semiconductor devices.

BACKGROUND

Normally off GaN/AlGaN HEMTs (high electron mobility transistors) are difficult to manufacture with sufficiently high threshold voltage and low $R_{DSON}$*Area FOM (where $R_{DSON}$ is the on-state resistance of the transistor and FOM is the transistor's figure of merit). In most applications, the normally-off device concept is highly preferred over the normally-on device concept, e.g. with respect to safety operations at fail, or to be compatible with standard drivers, etc. With the introduction of a non-planar normally off GaN HEMT concept, a high performance device with respect to high threshold voltage and low $R_{DSON}$*Area can be realized by creating a step in the gate region. However, in conventional non-planar normally off GaN HEMTs, the strongest (peak) channel arises at the AlGaN/gate insulator interface along the step in the gate region, where electrons cannot be supported from the main 2DEG (two-dimensional electron gas) channel because the barrier between the GaN/AlGaN interface must be overcome. This internal resistance leads to an improper transfer characteristic with poor threshold voltage control and high drain current (e.g. 1E-5 or higher) at even zero gate voltage, yielding a poorly functioning transistor. As such, a non-planar normally off GaN HEMT having a proper transistor transfer characteristic is desired.

SUMMARY

According to an embodiment of a normally-off compound semiconductor device, the normally-off compound semiconductor device comprises a first III-nitride semiconductor having a first sloped transition region in which the first III-nitride semiconductor transitions at an angle from a first level to a second level different than the first level, and a second III-nitride semiconductor on the first III-nitride semiconductor and having a different band gap than the first III-nitride semiconductor so that a two-dimensional charge carrier gas arises along an interface between the first and second III-nitride semiconductors. The normally-off compound semiconductor device further comprises a gate on the second III-nitride semiconductor and a doped semiconductor over the first sloped transition region and interposed between the gate and the second III-nitride semiconductor. The two-dimensional charge carrier gas is disrupted along the first sloped transition region due solely to the slope of the first sloped transition region if steep enough, or also due to the presence of the doped semiconductor which shifts the band edge in this region of the device.

According to an embodiment of a normally-off compound semiconductor transistor, the normally-off compound semiconductor transistor comprises a first III-nitride semiconductor having a sloped transition region in which the first III-nitride semiconductor transitions at an angle from a first level to a second level different than the first level, a second III-nitride semiconductor on the first III-nitride semiconductor and a two-dimensional electron gas along an interface between the first and the second III-nitride semiconductors. The two-dimensional electron gas is disrupted along the sloped transition region. The normally-off compound semiconductor transistor further comprises a passivation layer on the second III-nitride semiconductor, a gate on the second III-nitride semiconductor, a source contact and a drain contact spaced apart from one another and from the gate, and a doped semiconductor in place of the passivation layer over the sloped transition region and interposed between the gate and the second III-nitride semiconductor. The doped semiconductor causes a peak electron density to occur in the sloped transition region along the interface between the first and the second III-nitride semiconductors for gate voltages above a threshold voltage of the transistor. The threshold voltage exceeds 0.5V for drain voltages up to at least 50V.

According to another embodiment of a normally-off compound semiconductor device, the normally-off compound semiconductor device comprises a first III-nitride semiconductor having a first sloped transition region in which the first III-nitride semiconductor transitions at an angle from a first level to a second level different than the first level, and a second sloped transition region in which the first III-nitride semiconductor transitions at an angle from a third level to a fourth level different than the third level. The normally-off compound semiconductor device further comprises a second III-nitride semiconductor on the first III-nitride semiconductor and having a different band gap than the first III-nitride semiconductor so that a two-dimensional charge carrier gas arises along an interface between the first and second III-nitride semiconductors. The two-dimensional charge carrier gas is disrupted along the first and the second sloped transition regions. The normally-off compound semiconductor device further also comprises a passivation layer on the second III-nitride semiconductor and a gate on the passivation layer and over the first and the second sloped transition regions.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes

FIG. 13, which includes

DETAILED DESCRIPTION

The embodiments described herein provide a non-planar normally off compound semiconductor device such as an HEMT that has a true transistor transfer characteristic with good threshold voltage control and negligible drain current at sub-threshold gate voltages (e.g. around 10E-10 or lower, depending on the application). The term 'HEMT' used herein is also commonly referred to as HFET (heterostructure field effect transistor), MODFET (modulation-doped FET) and MESFET (metal semiconductor field effect transistor). The terms HEMT, HFET, MESFET, and MODFET are used interchangeably herein for referring to any III-nitride based compound semiconductor device incorporating a junction between two materials with different band gaps (i.e., a heterojunction) as the channel. For example, GaN may be combined with AlGaN or InGaN to form an electron gas inversion region as the channel. In each case and owing to the non-planar gate features which are described herein, the normally off compound semiconductor devices described herein behave much more like an ideal transistor as compared to conventional non-planar normally off compound semiconductor devices.

Figure 1:
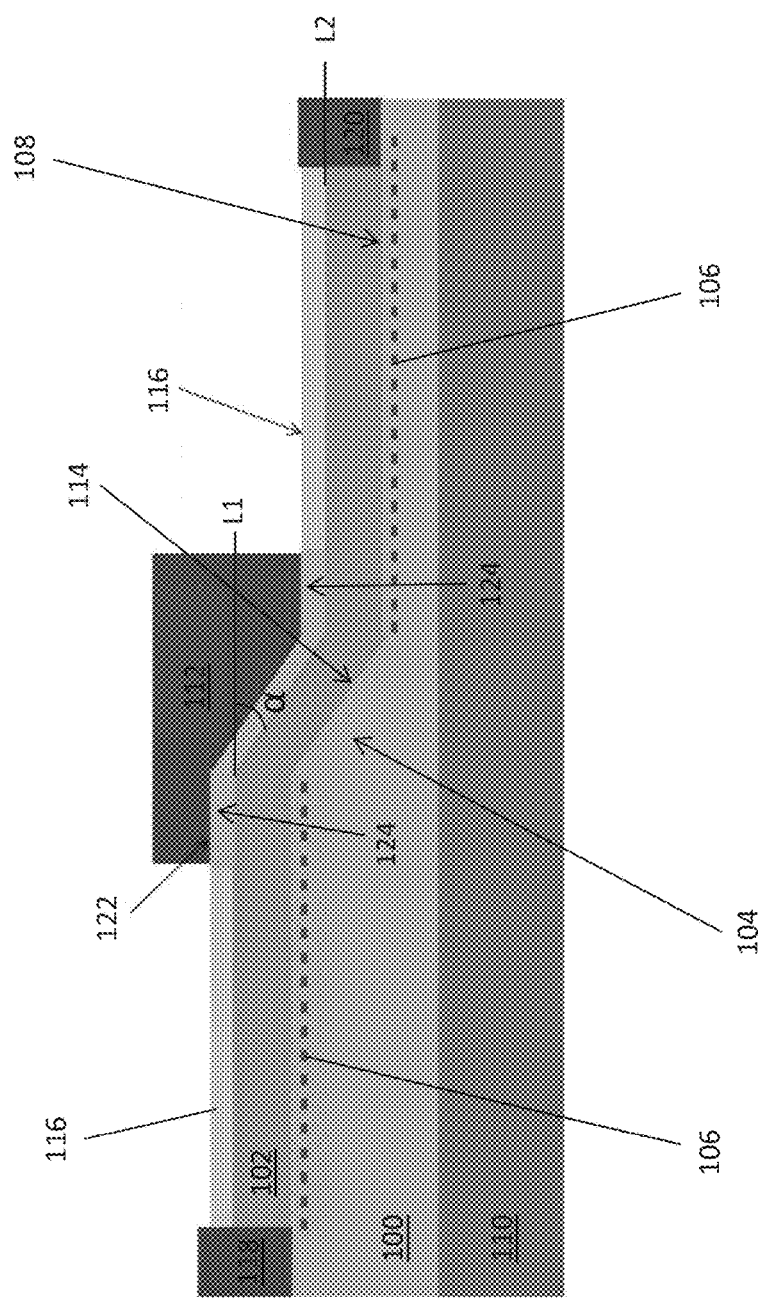
FIG. 1 illustrates a sectional view of an embodiment of a non-planar normally off compound semiconductor device.

FIG. 1 illustrates one embodiment of a non-planar normally off compound semiconductor device that has a true transistor transfer characteristic with good threshold voltage control and negligible drain current at sub-threshold gate voltages. According to this embodiment, the normally-off compound semiconductor device comprises a first III-nitride semiconductor 100 (also referred to interchangeably herein as a buffer layer) and a second III-nitride semiconductor (also referred to interchangeably herein as a barrier layer) 102 on the first III-nitride semiconductor 100. The first III-nitride semiconductor 100 has a first sloped transition region 104 in which the first III-nitride semiconductor 100 transitions at an angle ($\alpha$) from a first level (L1) to a second level (L2) different than the first level. The term 'level' as used herein refers to a generally horizontal surface or area. The vertical distance between the first and second levels divided by $\cos(\alpha)$ defines the channel length of the non-planar normally off compound semiconductor device. In one embodiment, the vertical distance between the first and second levels of the first III-nitride semiconductor 100 is about 100 nm or less.

The second III-nitride semiconductor 102 can be grown on the first III-nitride semiconductor 100 e.g. via a standard epitaxy process and has the same sloped/angled surface contour as the first III-nitride semiconductor 100. The second III-nitride semiconductor 102 has a different band gap than the first III-nitride semiconductor 100, so that a two-dimensional charge carrier gas 106 extends along the interface 108 between the first and second III-nitride semiconductors 100, 102. The two-dimensional charge carrier gas 106 arises in the junction between the two III-nitride semiconductors 100, 102, and forms the channel of the device.

Specifically with regard to GaN technology, the presence of polarization charges and strain effects in a GaN-based heterostructure body due to piezoelectric effects yield a two-dimensional charge carrier gas 106 in the heterostructure body characterized by very high carrier density and carrier mobility. This two-dimensional charge carrier gas 106, such as a 2DEG (two-dimensional electron gas) or 2DHG (two-dimensional hole gas), forms the conductive channel of the device near the interface 108 between, e.g., a GaN alloy barrier layer 102 such as AlGaN or InAlGaN and a GaN buffer layer 100. A thin, e.g. 1-2 nm, AlN layer can be provided between the GaN buffer layer 100 and the GaN alloy barrier layer 102 to minimize alloy scattering and enhance 2DEG mobility. In a broad sense, the compound semiconductor devise described herein can be formed from any binary, ternary or quaternary III-nitride compound semiconductor material where piezoelectric effects are responsible for the device concept. The GaN buffer layer 100 can be manufactured on a semiconductor substrate 110 such as a Si or SiC substrate, on which a nucleation (seed) layer such as an AlN layer can be formed for providing thermal and lattice matching to the GaN buffer layer 100. The non-planar normally off compound semiconductor device also may have AlInN/AlN/GaN barrier/spacer/buffer layer structures. In general, the non-planar normally off compound semiconductor device can be realized using any suitable III-nitride technology such as GaN that permits the formation of opposite polarity inversion regions due to piezoelectric effects.

Spontaneous and piezoelectric polarization are usually responsible for the build-up of the two-dimensional charge carrier gas 106 (2DEG or 2DHG) in a GaN/GaN alloy 100/102 heterostructure transistor device. This mechanism only works in the c-plane orientation. The two-dimensional charge carrier gas 106 can be disrupted along the first sloped transition region 104 due solely to the slope of the first sloped transition region 104 if the angle $\alpha$ is steep enough, yielding a normally off device. In this case, the c-plane orientation is missing in the first sloped transition region 104 and the build-up of the spontaneous and piezoelectric polarization is prevented and thus the two-dimensional charge carrier gas channel 106 is interrupted along the slanted region 104. To achieve such an effect, the angle $\alpha$ of the transition measured between the first level L1 and the sidewall 114 of the first sloped transition region 104 is between +45 degrees and +90 degrees in FIG. 1. Due to the resulting discontinuity (disruption) of the two-dimensional charge carrier gas 106 along the first sloped transition region 104, a normally off behavior is obtained for the non-planar compound semiconductor device.

The non-planar normally off compound semiconductor device further comprises a passivation layer 116 on the second III-nitride semiconductor 102, a gate 112 on the second III-nitride semiconductor 102 and source and drain contacts 118, 120 spaced apart from one another. The gate 112 controls the conducting or non-conducting state of the two-dimensional charge carrier gas channel 106. The channel 106 of the normally-off should be disrupted absent a voltage applied to the gate 112. To achieve such normally off behavior and a true transistor transfer characteristic, the compound semiconductor device also comprises a doped semiconductor 122 in place of the passivation layer 116 at least over the sloped transition region 104 of the first III-nitride semiconductor 100 and interposed between the gate 112 and the second III-nitride semiconductor 102. The doped semiconductor 122 shifts the band edge along the sloped transition region 104. The angle α of the first sloped transition region 104 may not be steep enough to disrupt the two-dimensional charge carrier gas 106 along the first sloped transition region 104 due solely to the presence of the first sloped transition region 104. In this case, the angle α of the first sloped transition region 104 is sufficient to at least reduce the density of the two-dimensional charge carrier gas 106 in the sloped channel region of this device. The doped semiconductor 122 shifts the band edge in the sloped channel region of the device so that the reduced density two-dimensional charge carrier gas 106 in this region is disrupted along the first sloped transition region 104, yielding a normally off device. As such, the device can be made normally off solely by the presence of the first sloped transition region 104 if the angle α of the first sloped transition region 104 is sufficiently steep e.g. between +45 degrees and +90 degrees for the device of FIG. 1, or also in conjunction with the doped semiconductor 122 which shifts the band edge in the sloped channel region of the device.

In one embodiment, the first III-nitride semiconductor 100 (buffer layer) comprises GaN, the second III-nitride semiconductor 102 (barrier layer) comprises AlGaN and the doped semiconductor 122 comprises p-doped GaN. In another embodiment, the first III-nitride semiconductor 100 comprises GaN, the second III-nitride semiconductor 102 comprises AlGaN and the doped semiconductor 122 comprises p-doped AlGaN having lower Al content than the second III-nitride semiconductor 102.

In general, the properties of the doped semiconductor 122 shift the conduction band in such a way, that only a single channel is formed near the interface 108 between the III-nitride semiconductors 100, 102 (buffer and barrier layers) in the gate region of the device. Also, there is no restriction placed on the thickness or composition of the second III-nitride semiconductor 102. As such, the threshold voltage of the non-planar normally off compound semiconductor device is not determined by polarization charges. This in turn allows for more aggressive $R_{DSON}$*Area FOM values similar to those of normally on device concepts.

The two-dimensional charge carrier gas 106 can still be present under the horizontal i.e. the non-sloped/angled part(s) 124 of the gate 112 as shown in FIG. 1. For example if the channel density is relatively high, then the two-dimensional charge carrier gas 106 can still be present under the horizontal part(s) 124 of the gate 112. In this case, the two-dimensional charge carrier gas 106 has a lower density but is not disrupted under the gate 112 outside the first sloped transition region 104 of the first III-nitride semiconductor 100 (buffer layer). For lower channel densities, the two-dimensional charge carrier gas 106 is interrupted under both the horizontal and sloped/angled parts of the gate 112. In either case, the electron density distribution along the sloped transition region 104 below the gate 112 is very low (e.g. below 2E13) when no voltage is applied to the gate 112 to ensure the device is normally off.

Figures 2A, 2B:
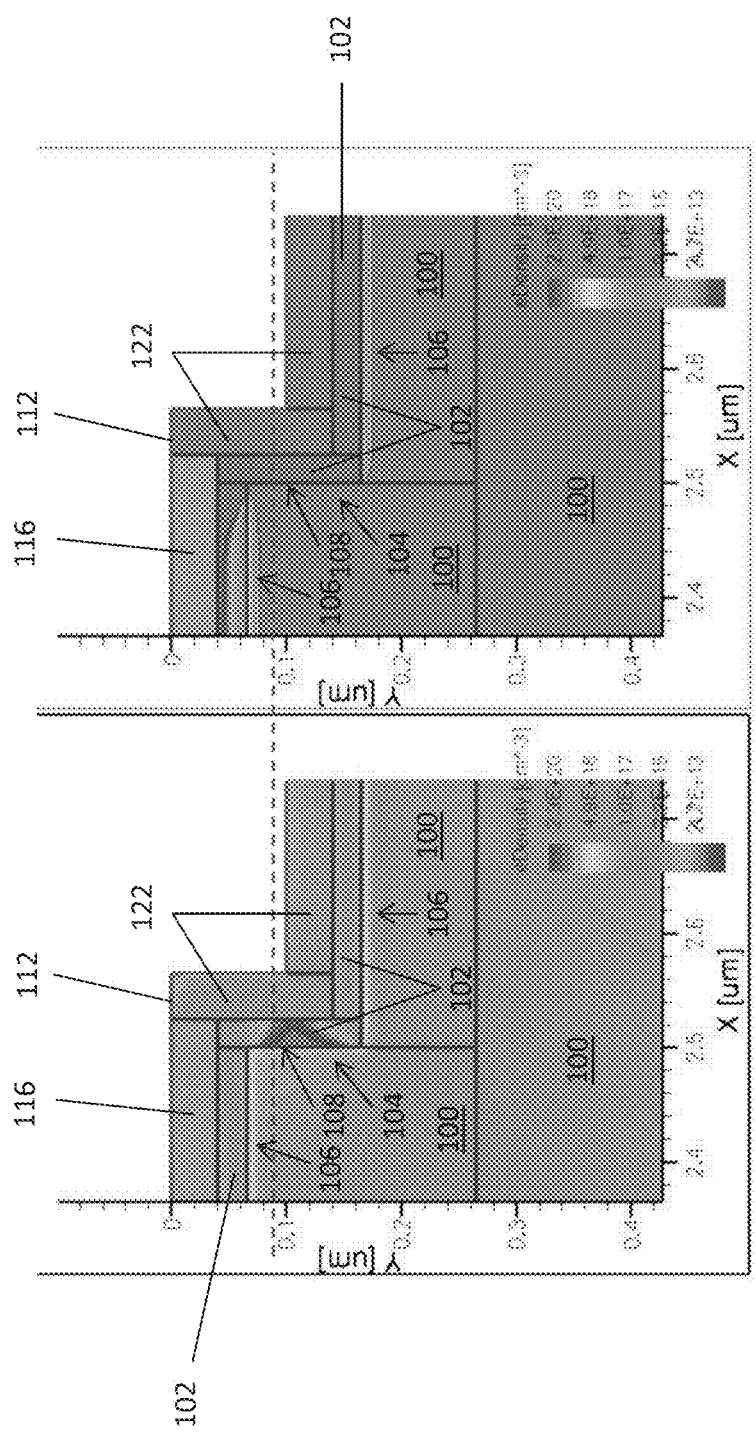
FIGS. 2A and 2B, shows the electron density distribution of the non-planar normally off compound semiconductor device of FIG. 1 around the sloped transition region below the gate for gate voltages above the threshold voltage (FIG. 2A) and zero gate voltage (FIG. 2B).

FIG. 2, which includes FIGS. 2A and 2B, shows the electron density distribution of the non-planar normally off compound semiconductor device around the sloped transition region 104 below the gate 112. The simulation was done for a GaN barrier layer 100, an AlGaN buffer layer 102, a p-doped GaN semiconductor 122 that replaces the passivation layer 116 over the sloped transition region 104 of the first III-nitride semiconductor 100, and an angle α=90°. FIG. 2A shows the electron density (eDensity) distribution around the sloped/angled part of the device for gate voltages (Vg) above the threshold voltage (Vt). FIG. 2B shows the electron density (eDensity) distribution around the sloped/angled part of the device for Vg=0V. The electron density is extracted at the position of the dashed line in FIG. 2 and illustrated in FIG. 3, where the single channel formation at around 2.5 μm in this non-limiting example can be readily observed. Due to the single 2DEG channel 106 near the GaN/AlGaN interface 108 and the missing barriers, a true transistor transfer characteristic is obtained for the non-planar normally off compound semiconductor device as shown in FIG. 4. Particularly, the doped semiconductor 122 causes the peak electron density to occur in the first sloped transition region 104 along the interface 108 between the first and second III-nitride semiconductors 100, 102 when a voltage applied to the gate 112 exceeds the threshold voltage of the device.

Replacing the passivation layer 116 with the doped semiconductor 122 over the sloped transition region 104 of the first III-nitride semiconductor 100 avoids a dual electron channel configuration that plagues conventional non-planar normally off compound semiconductor devices. The missing c-plane orientation in the slanted/angled part 104 of the buffer layer 100 is responsible for the corresponding lack of the spontaneous and piezoelectric polarization in this region, and therefore for the disruption of the two-dimensional charge carrier gas channel 106 along the slanted/angled part of the gate region. With a conventional MIS (metal-insulator-semiconductor) gate module where the gate is separated from the barrier layer by only a dielectric passivation in the slanted/angled gate area, a dual electron channel arises and the channel nearest the gate cannot be supported by the access electrons due to the barrier. Furthermore, the channel nearest the gate suppresses the second channel which renders the device not usable as a transistor. By replacing the passivation layer 116 with the doped semiconductor 122 over the sloped transition region 104 of the device, a single channel 106 is formed in this region of the device which results in a proper transistor switching characteristic with good threshold voltage control and negligible drain current at sub-threshold gate voltages (e.g. around 10E-10 or lower, depending on the application) as shown in FIG. 4.

Figure 5:
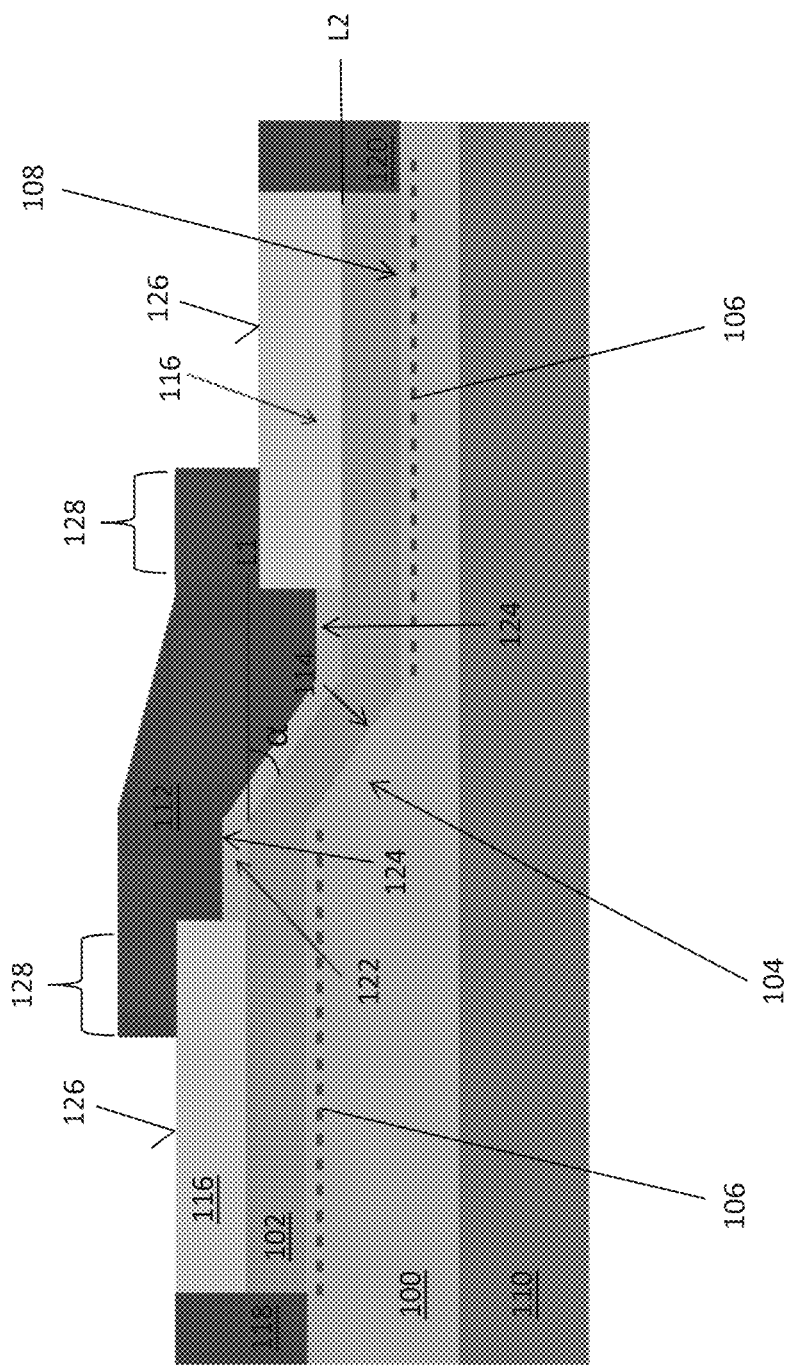
FIG. 5 illustrates a sectional view of another embodiment of a non-planar normally off compound semiconductor device.

FIG. 5 illustrates another embodiment of a non-planar normally off compound semiconductor device that has a true transistor transfer characteristic with good threshold voltage control and negligible drain current at sub-threshold gate voltages. The embodiment shown in FIG. 5 is similar to the embodiment shown in FIG. 1. However, the gate 112 extends onto the surface 126 of the passivation layer 116 facing away from the second III-nitride semiconductor 102 in FIG. 5. The gate 112 extends onto the surface 126 of the passivation layer 116 at least in a direction toward the drain contact 120. The gate 112 can also extend onto the surface 126 of the passivation layer 116 in a direction toward the source contact 118. The extended part(s) 128 of the gate 112 act as field plates which reduce the electric fields in the vicinity of the gate edges towards at least the drain and also optionally toward the source. In FIG. 5, the field plates are implemented as part of the gate stack and can be slanted/angled. Alternatively or additionally, the field plates can also be realized in the next metal level or metal levels such as the first metal level above the gate or even in the power metal level (such metal levels are shown in FIG. 5 for ease of illustration).

The non-planar normally off compound semiconductor devices shown in FIGS. 1 and 5 are very robust at relatively low drain voltages. At higher drain voltages associated with high-power applications, the non-planar normally off compound semiconductor devices shown in FIGS. 1 and 5 can experience a strong shift in the threshold voltage (Vt) due to the DIBL (drain induced barrier lowering) effect for short gate length which is typically preferred. For long gate length e.g. at least 1 μm, the DIBL is not as severe.

Figure 3:
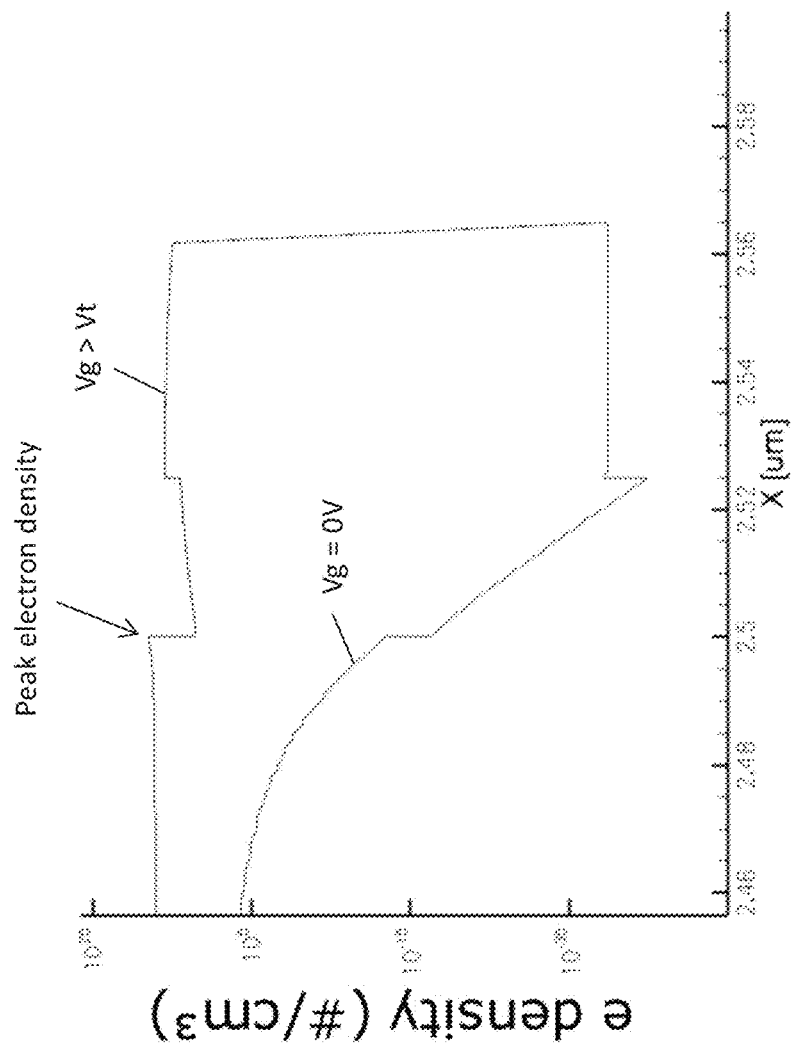
FIG. 3 is a plot diagram illustrating the electron density extracted at the position of the dashed line in FIG. 2.
Figure 4:
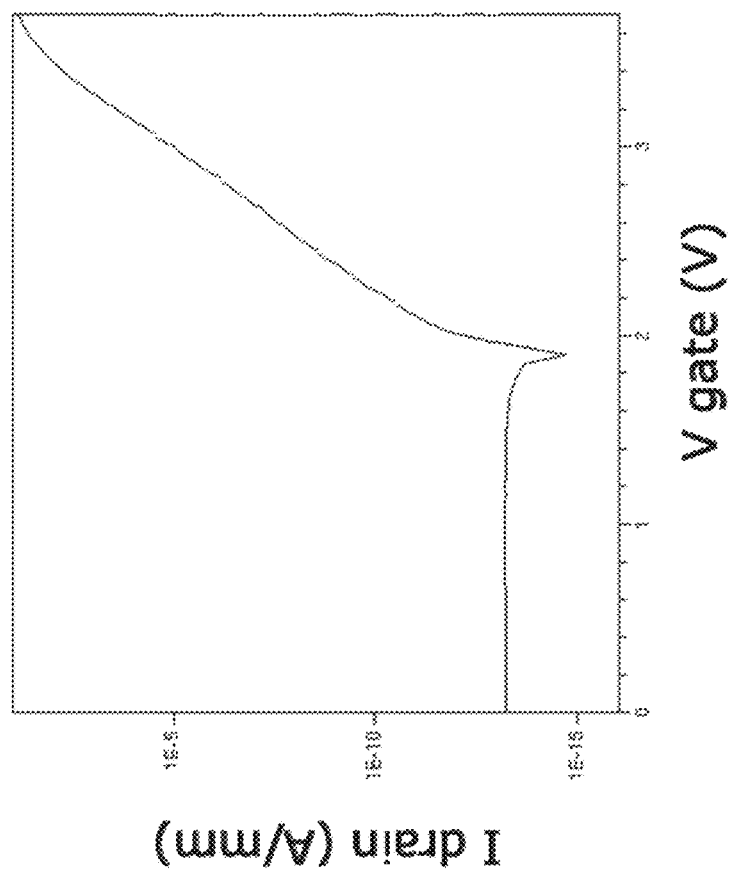
FIG. 4 is a plot diagram illustrating the transfer characteristic for the non-planar normally off compound semiconductor device shown in FIG. 1.
Figure 6:
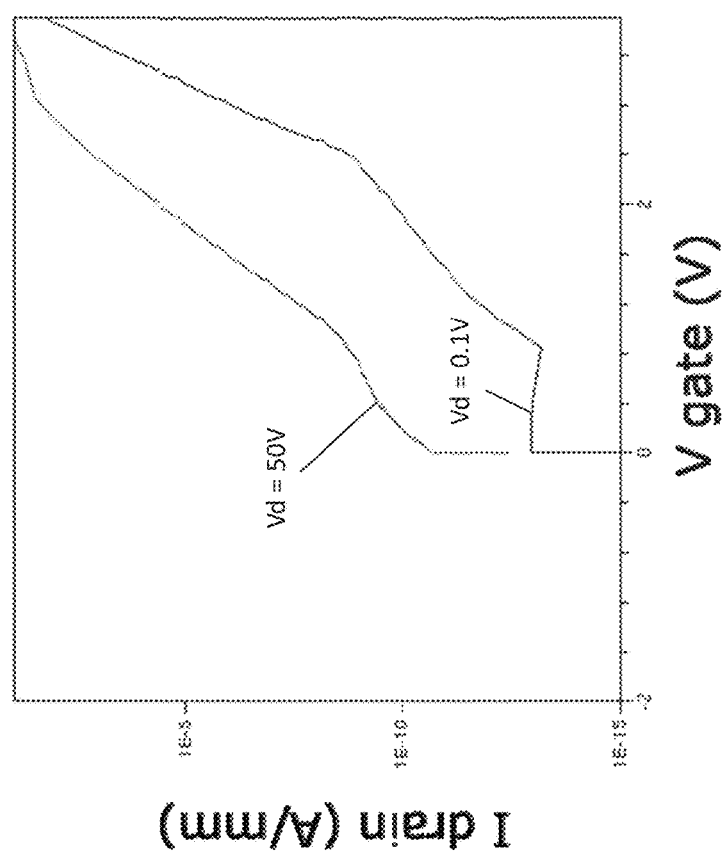
FIG. 6 is a plot diagram illustrating the transfer characteristic for the non-planar normally off compound semiconductor device shown in FIG. 5 at different drain voltages.

FIG. 6 plots drain current versus gate voltage for the same device simulated in FIGS. 2-4, for applied drain voltages (Vd) of 0.1V and 50V. A strong shift in the threshold voltage occurs due to the DIBL effect at higher drain voltages. This shift in the threshold voltage can be at least partly counteracted by the increasing the depth of the first sloped transition region 104 of the first III-nitride semiconductor 100 (buffer layer). However, this in turn increases the channel length which simultaneously increases the $R_{DSON}$*Area FOM.

Figure 7:
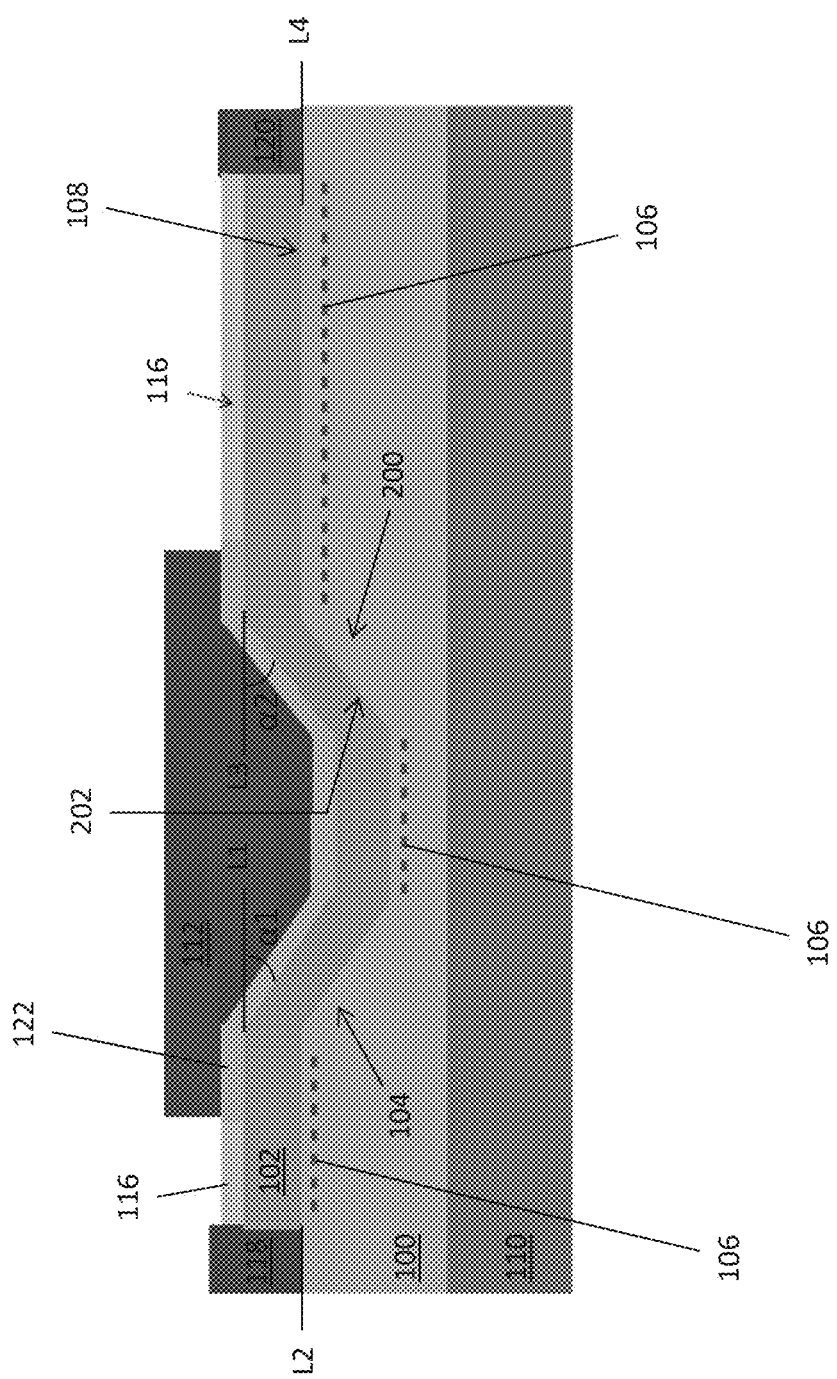
FIG. 7 illustrates a sectional view of yet another embodiment of a non-planar normally off compound semiconductor device.

FIG. 7 illustrates an embodiment of a non-planar normally off compound semiconductor device that has a true transistor transfer characteristic with good threshold voltage control and negligible drain current at sub-threshold gate voltages even at relatively high drain voltages e.g. of at least 50V. According to this embodiment, the first III-nitride semiconductor 100 (buffer layer) has a second sloped transition region 200 in which the first III-nitride semiconductor 100 transitions at an angle (α2) from a third level (L3) to a fourth level (L4) different than the third level. The angle α2 of the transition measured between the third level L3 and the sidewall 202 of the second sloped transition region 200 is between +45 degrees and +90 degrees in FIG. 7 so as to disrupt the two-dimensional charge carrier gas channel 106 under this part of the gate 112 due to the lack of c-plane orientation in this region of the interface 108 between the buffer and barrier layers 100, 102. The first and the third levels can be coplanar, and the second and the fourth levels can also be coplanar as shown in FIG. 7. This way, the source and drain contacts 118, 120 can be at the same level in the device. In other embodiments, the first and third levels are vertically offset from one another and the second and fourth levels are also vertically offset from one another.

Further according to the embodiment of FIG. 7, the doped semiconductor 122 extends continuously under the gate 112 from the first sloped transition region 104 to the second sloped transition region 200. As such, the doped semiconductor 122 also replaces the passivation layer 116 over the second sloped transition region 200 and is interposed between the gate 112 and the second III-nitride semiconductor 200 at the side of the gate 112 opposite the first sloped transition region 104.

The sloped transition 200 region towards the drain side is provided to intentionally shield the sloped transition region 104 towards the source side from the DIBL effect. As a result, the sloped transition region 200 towards the drain side acts as a 'sacrificial' region that absorbs most of the DIBL effect and has a relatively low threshold voltage. This way, the sloped transition region 104 towards the source side defines the threshold voltage of the device. Because the threshold voltage is defined by a sloped transition region 104 that is not affected by the DIBL effect, no threshold voltage shift occurs for higher applied drain voltages and the device has a high threshold voltage (Vt) e.g. above 0.5 V even at relatively high drain voltages e.g. up to at least 50V. In addition and similar to the single sloped transition region embodiments shown in FIGS. 1 and 5, there is no restriction on the thickness/composition of the barrier layer 102.

Like the embodiments in FIGS. 1 and 5, the embodiment in FIG. 7 overcomes the limitation of a planar pGaN HEMT structure in that the threshold voltage is not determined by polarization charges. Also, the two-dimensional charge carrier gas 106 can remain present below the gate region between the sloped transition regions 104, 200 on the drain and source sides of the gate 112 as indicated by the minus ('−') signs under the middle part of the gate 112 in FIG. 7. Such a configuration provides low $R_{DSON}$*Area FOM values, because the effective gate length can be kept low (mainly restricted to the total length i.e. height of the sloped transition region 104 on the source-side of the device). The part of the device between the sloped transition regions 104, 200 on either side of the gate 112 can be treated as a normally on device, allowing for more aggressive $R_{DSON}$*Area FOM values similar to normally on device concepts. Whether the two-dimensional charge carrier gas 106 remains present under the horizontal part of the gate 112 between the sloped transition regions 104, 200 is a design choice and depends on the type of barrier layer. If the two-dimensional charge carrier gas 106 is disrupted under the horizontal part of the gate 112 between the sloped transition regions 104, 200, then higher $R_{DSON}$ results.

Figure 8:
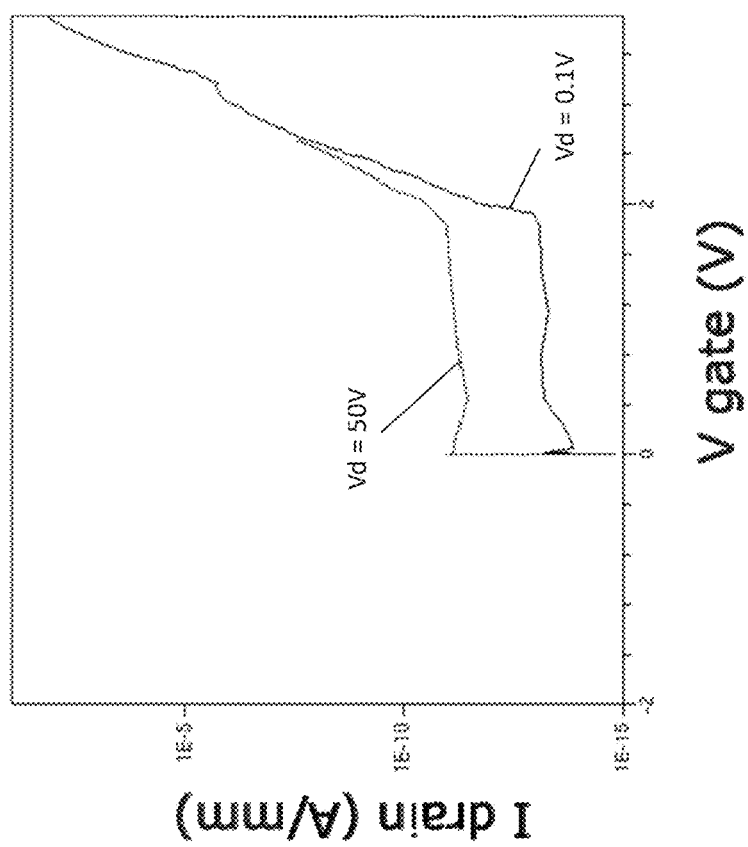
FIG. 8 is a plot diagram illustrating the transfer characteristic for the non-planar normally off compound semiconductor device shown in FIG. 7 at different drain voltages.
Figure 9:
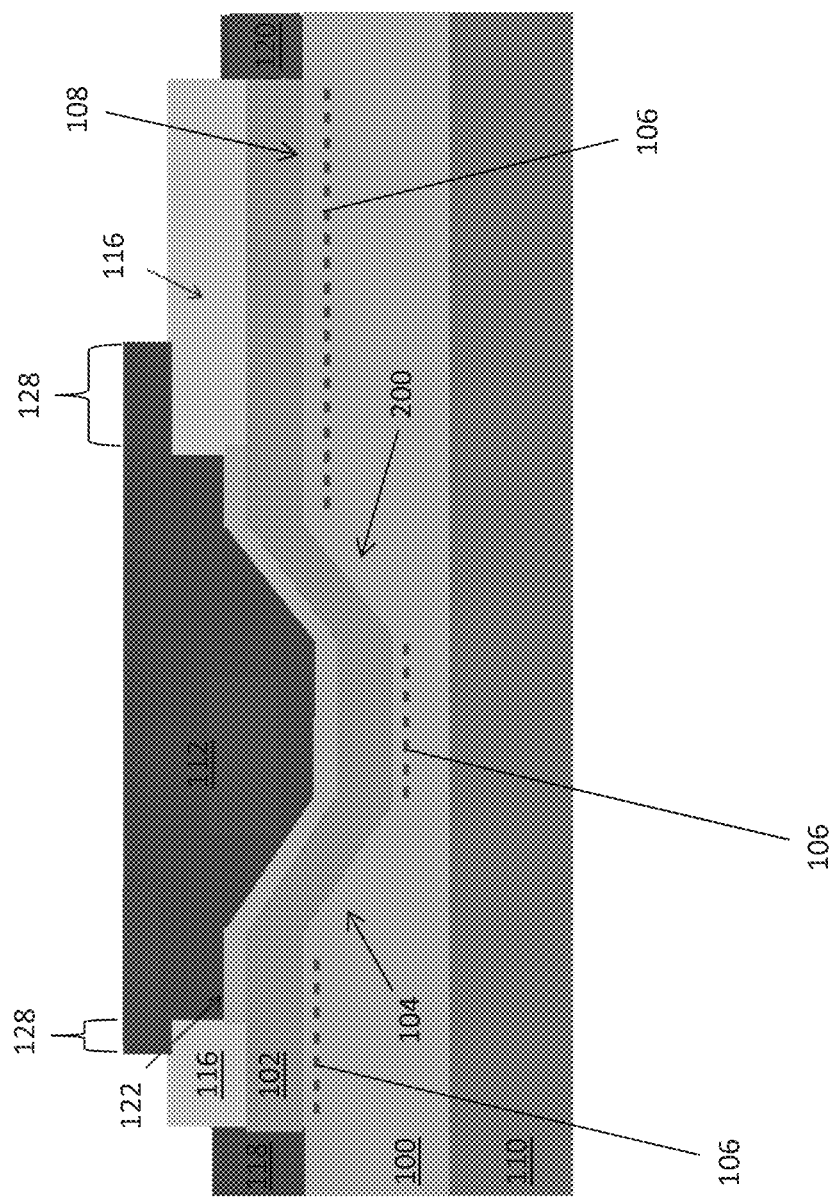
FIG. 9 illustrates a sectional view of still another embodiment of a non-planar normally off compound semiconductor device.

FIG. 8 shows simulation results for the non-planar normally off compound semiconductor device of FIG. 7 used to calculate the DIBL effect. The simulation was done for a GaN barrier layer, an AlGaN buffer layer, a p-doped GaN semiconductor that replaces the passivation layer over the sloped transition regions of the III-nitride semiconductors, and angles α1=α2=90°. Also, the part between the sloped transition regions on either side of the gate was treated as a normally on device for the simulation. FIG. 9 shows the corresponding transfer characteristic for a drain voltage Vd=0.1V and Vd=50V, where the DIBL effect is completely suppressed at sub-threshold gate voltages. In one embodiment, the normally-off compound semiconductor device has a threshold voltage above 0.5V for drain voltages up to at least 50V and the device has a drain current of around 10E-10 or lower for sub-threshold gate voltages.

Figure 10:
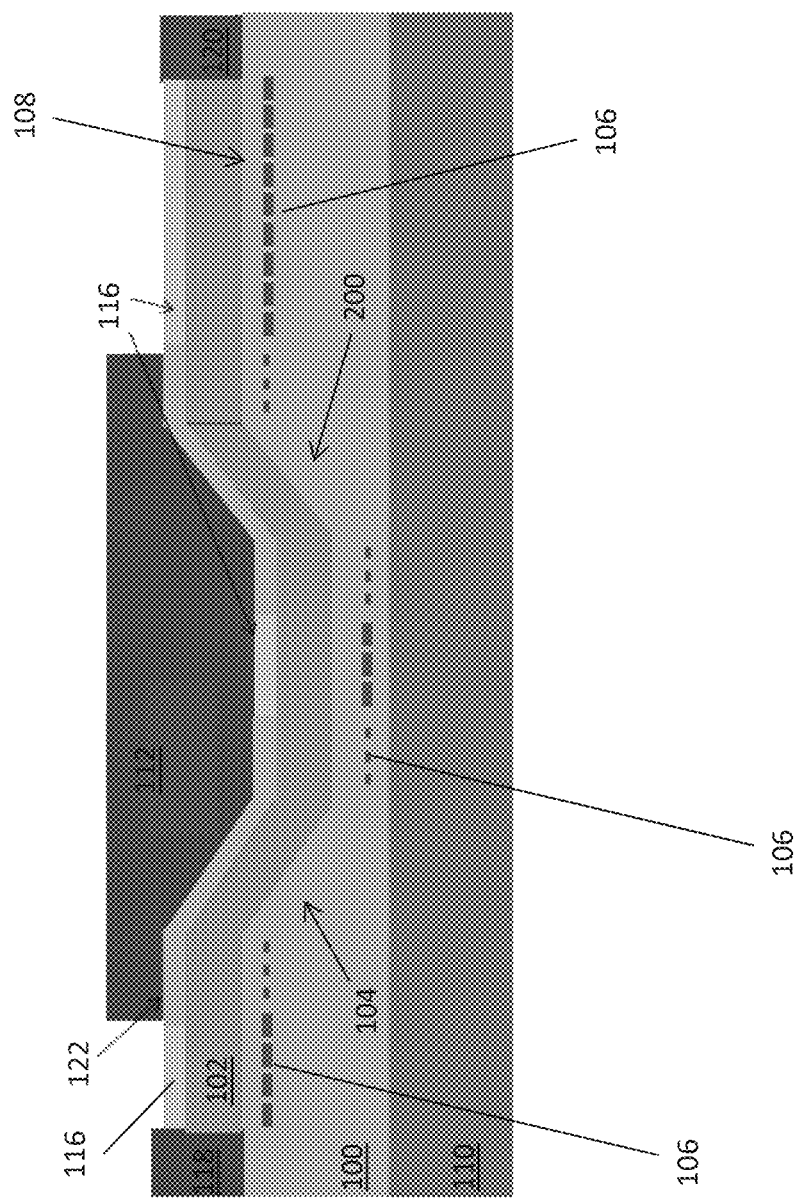
FIG. 10 illustrates a sectional view of another embodiment of a non-planar normally off compound semiconductor device.

FIG. 9 illustrates another embodiment of a non-planar normally off compound semiconductor device that has a true transistor transfer characteristic with good threshold voltage control and negligible drain current at sub-threshold gate voltages even at relatively high drain voltages e.g. of at least 50V. The embodiment shown in FIG. 10 is similar to the embodiment shown in FIG. 7. However, the gate 112 extends onto the passivation layer 116 at least in a direction toward the drain contact 120. The gate 112 can also extend onto the passivation layer 116 in a direction toward the source contact 118. The extended part(s) 128 of the gate 112 act as field plates as previously described herein. Alternatively or additionally, the field plates can also be realized in one or more metal levels (not shown) above the gate 112 also as previously described herein.

Figure 11:
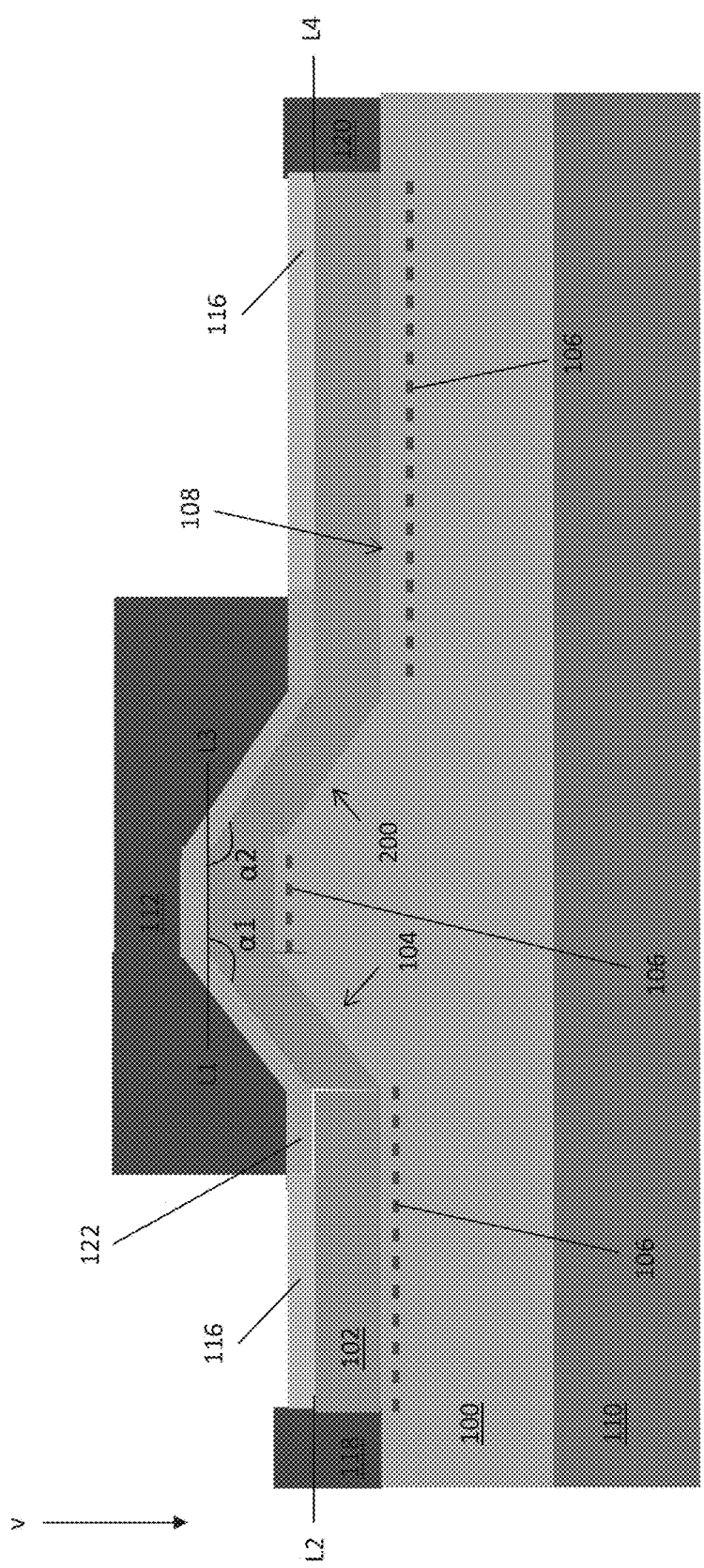
FIG. 11 illustrates a sectional view of another embodiment of a non-planar normally off compound semiconductor device.

FIG. 10 illustrates yet another embodiment of a non-planar normally off compound semiconductor device that has a true transistor transfer characteristic with good threshold voltage control and negligible drain current at sub-threshold gate voltages even at relatively high drain voltages e.g. of at least 50V. The embodiment shown in FIG. 11 is similar to the embodiment shown in FIG. 7. However, a portion of the passivation layer 116 remains under the horizontal part of the gate 112 between the first sloped transition region 104 and the second sloped transition region 200 of the first III-nitride semiconductor 100 (buffer layer). This portion of the passivation layer 116 is laterally adjacent the doped semiconductor 122 toward the drain and toward the source. Because the doped semiconductor 122 between the sloped transition regions 104, 200 of the buffer layer 100 is interrupted, the density of the two-dimensional charge carrier gas 106 is increased under the horizontal part of the gate 112 between the first and second sloped transition regions 104, 200. The increased two-dimensional charge carrier gas density is schematically illustrated in FIG. 10 by the larger minus ('−') signs below the portion of the passivation layer 116 that remains under the horizontal part of the gate 112. With this approach, the $R_{DSON}$ of the device can be further decreased.

FIG. 11 illustrates another embodiment of a non-planar normally off compound semiconductor device that has negligible drain current at sub-threshold gate voltages. The embodiment shown in FIG. 11 is similar to the embodiment shown in FIG. 7. However, the source and drain contacts 118, 120 are disposed below the gate 112 in a vertical direction v. As such, the angle α1 of the first sloped transition region 104 and the angle α2 of the second sloped transition region 200 are negative angles measured between the respective levels L1/L2 and L3/L4. If the angles α1 and α2 range are sufficiently steep e.g. range between −45 degrees and −90 degrees, the two-dimensional charge carrier gas channel 106 is disrupted under the slanted/angled parts of the gate 112 due to the lack of c-plane orientation in this region of the interface 108 between the buffer and barrier layers 100, 102 and therefore yields a normally off device as previously described herein. If the angles α1 and α2 are less steep, then the density of the two-dimensional charge carrier gas channel 106 is reduced under the slanted/angled parts of the gate 112. The doped semiconductor 122 shifts the band edge under the gate 112, disrupting the lower density two-dimensional charge carrier gas channel 106 under the sloped/angled parts of the gate 112 and therefore yielding a normally off device also as previously described herein.

Figure 12:
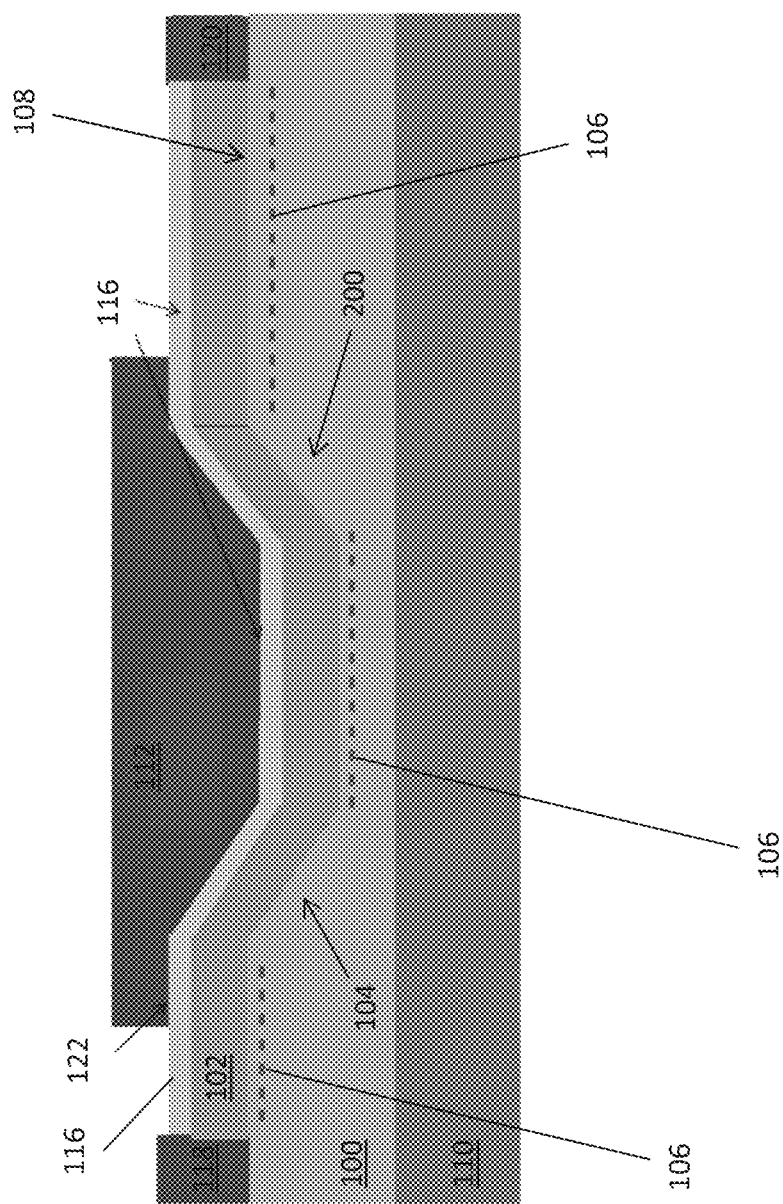
FIG. 12 illustrates a sectional view of another embodiment of a non-planar normally off compound semiconductor device.

FIG. 12 illustrates another embodiment of a non-planar normally off compound semiconductor device that has negligible drain current at sub-threshold gate voltages. The embodiment shown in FIG. 12 is similar to the embodiment shown in FIG. 7. However, the doped semiconductor region 122 is not interposed between the gate 112 and the barrier layer 102 over either sloped transition region 104, 200 of the buffer layer 100. Instead, the passivation layer 116 extends continuously under the gate 112 from the source-side of the gate 112 to the drain-side of the gate 112 without interruption according to this embodiment.

FIG. 13, which includes FIGS. 13A through 13G, illustrates an embodiment of manufacturing a non-planar normally off compound semiconductor device that has a true transistor transfer characteristic with good threshold voltage control and negligible drain current at sub-threshold gate voltages.

Figure 13A:
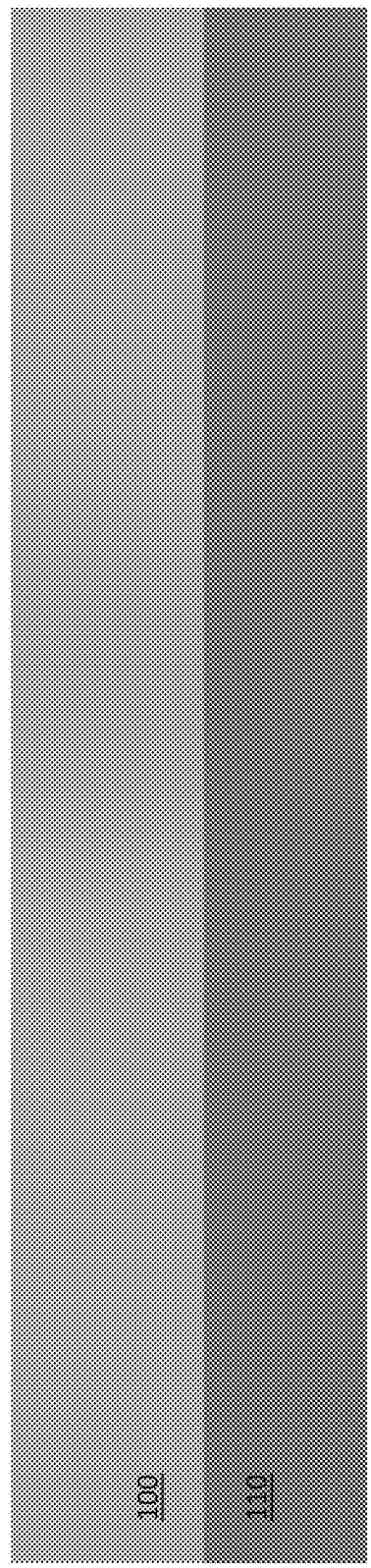
FIGS. 13A through 13G, illustrates an embodiment of a method of manufacturing a non-planar normally off compound semiconductor device.

FIG. 13A shows the first III-nitride semiconductor 100 (buffer layer) grown e.g. via a first epitaxial process on a substrate 110 such as a Si or SiC substrate that can have one or more nucleation (seed) and/or lattice transition layer(s) such as AlN/GaN/InAlGaN/AlN based layers as previously explained herein.

Figure 13B:
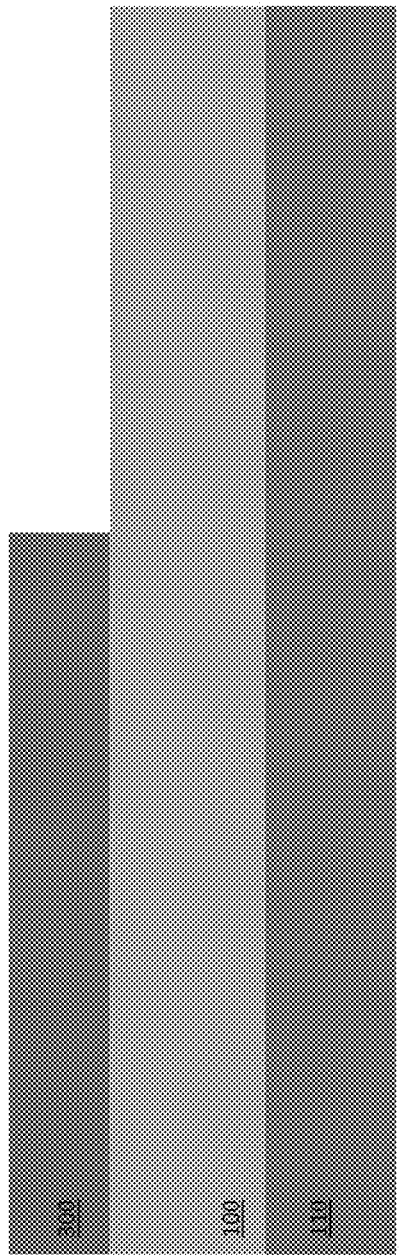

FIG. 13B shows a mask 300 formed on the first III-nitride semiconductor 100. The mask 300 is selected so that the first III-nitride semiconductor 100 can be etched selective to the mask 300.

Figure 13C:
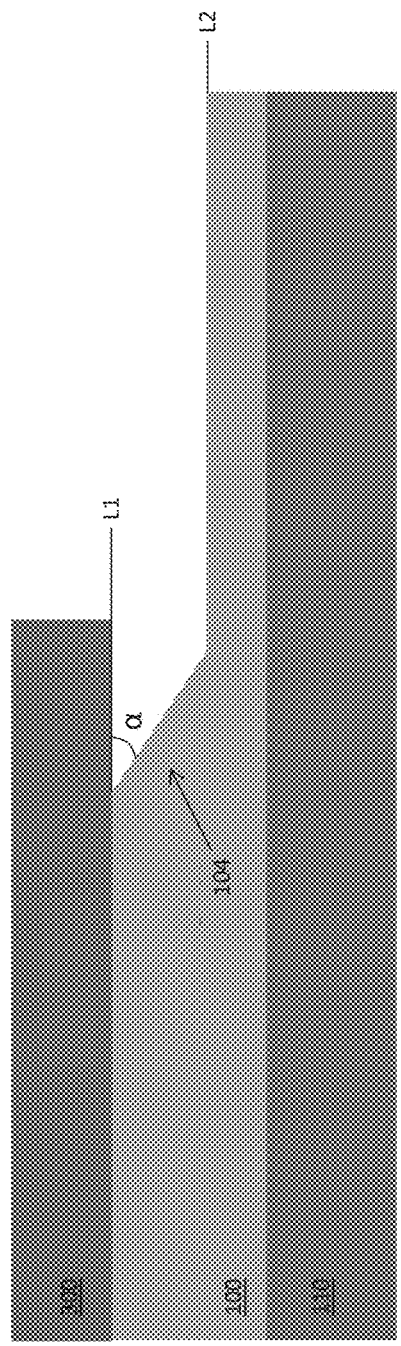

FIG. 13C shows the first III-nitride semiconductor 100 after an etching process in which a first sloped transition region 104 is etched into the unmasked part of the first III-nitride semiconductor 100 with some undercut. The first sloped transition region 104 transitions at an angle α from a first level (L1) to a second level (L2) different than the first level as previously described herein. A second sloped transition region (out of view) similarly can be formed in the first III-nitride semiconductor 100 during the etching process, by pattering the mask 300 appropriately. This way, the first III-nitride semiconductor 100 can have a single-step profile as shown in FIGS. 1 and 5 or a double-step profile as shown in FIGS. 7 and 9-12.

Figure 13D:
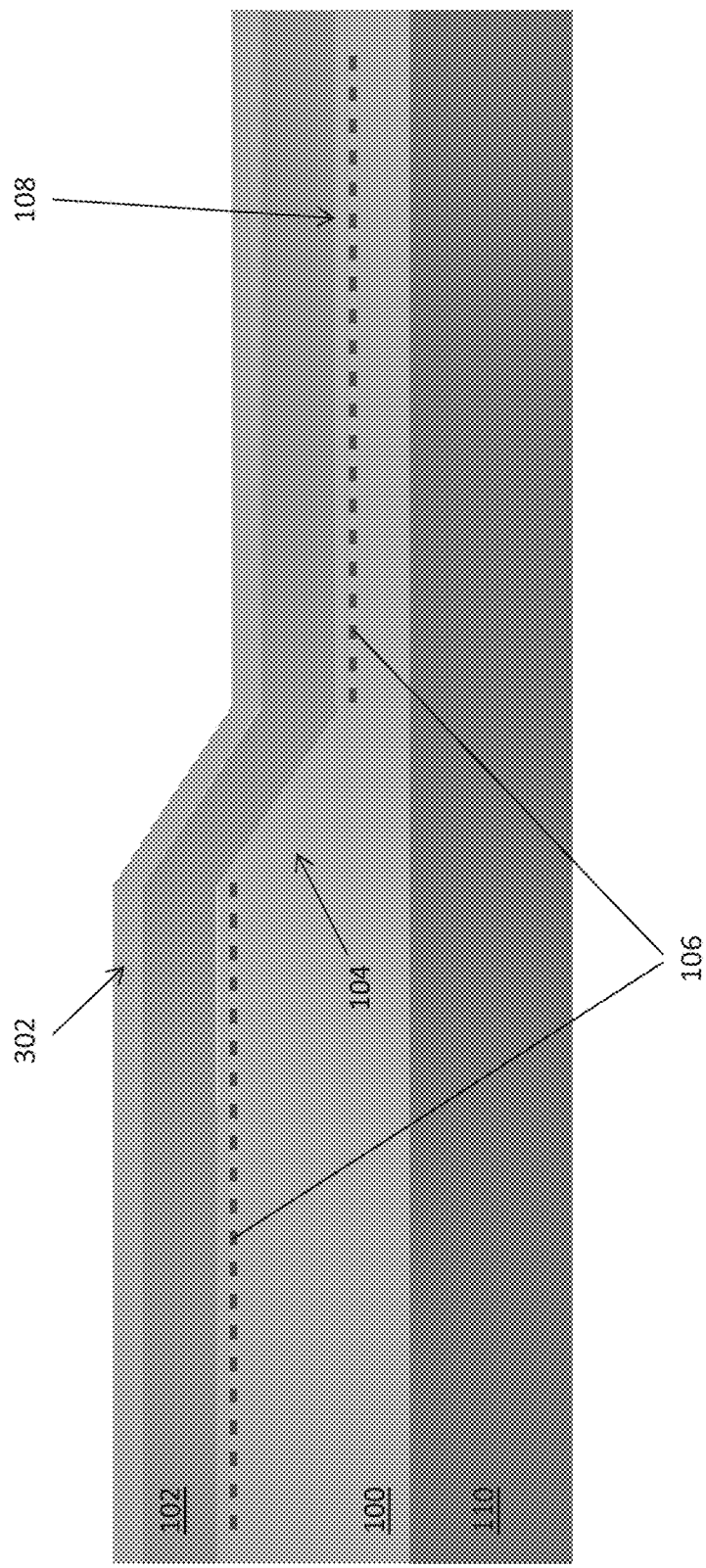

FIG. 13D shows the second III-nitride semiconductor 102 (barrier layer) grown on the first III-nitride semiconductor 100, and a doped semiconductor layer 302 such as p-doped GaN or p-doped AlGaN in the case of an GaN/AlGaN heterostructure grown on the second III-nitride semiconductor 102 e.g. via a second epitaxial process after the mask 300 is removed. The second III-nitride semiconductor 102 and the doped semiconductor layer 302 have the same sloped/angled surface contours as the first III-nitride semiconductor 100. The first sloped transition region 104 of the first III-nitride semiconductor 100 can be angled/sloped such that the two-dimensional charge carrier gas 106 that arises in the first III-nitride semiconductor 100 near the interface 108 between the two III-nitride semiconductors 100, 102 is disrupted along the first sloped transition region 104 to yield a normally off device as previously described herein. In general, the device can be made normally off solely by the presence of the first sloped transition region 104 if the angle α of the first sloped transition region 104 is sufficiently steep e.g. between +45 degrees and +90 degrees or between −45 degrees and −90 degrees depending on the position of the gate, or also in conjunction with the doped semiconductor 302 which shifts the band gap in the sloped channel region of the device.

Figure 13E:
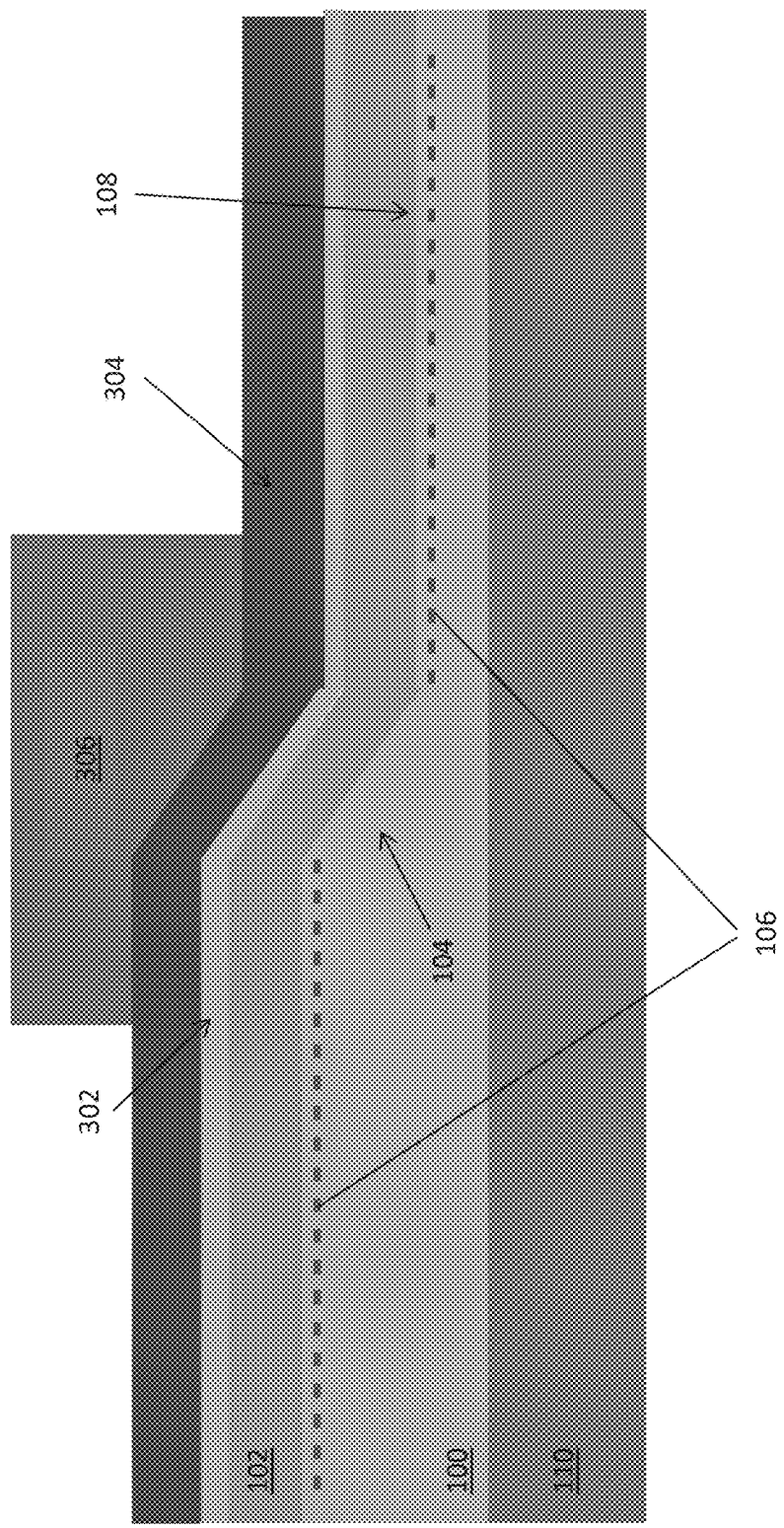

FIG. 13E shows a gate conductor layer 304 such as a metal layer deposited on the doped semiconductor layer 302 and a gate mask 306 on the gate conductor layer 304. The gate mask 306 is selected so that the gate conductor layer 304 and the doped semiconductor layer 302 can be etched selective to the gate mask.

Figure 13F:
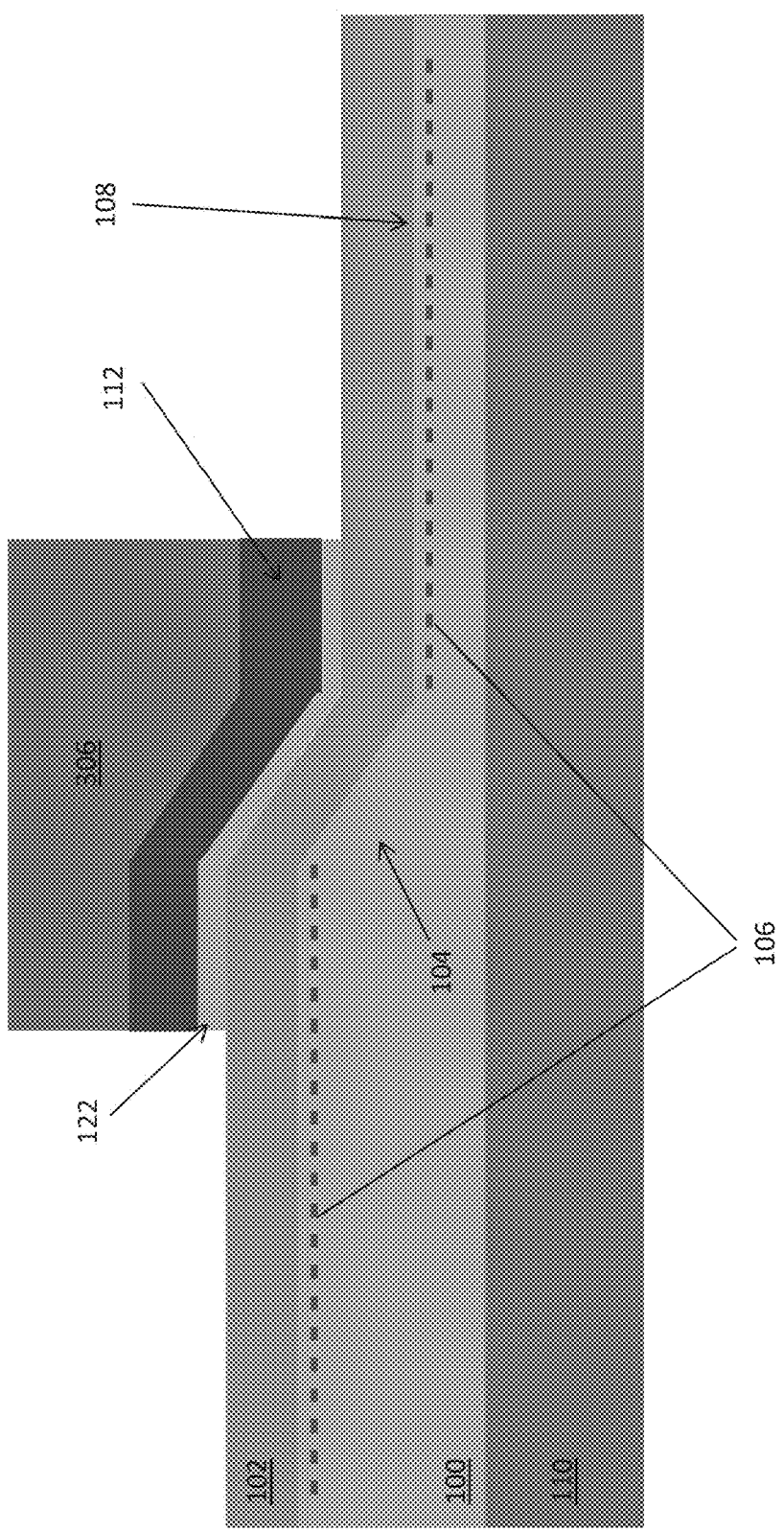

FIG. 13F shows the gate conductor layer 304 and the underlying doped semiconductor layer 302 etched selective to the gate mask 306. The remaining part of the gate conductor layer 304 forms the gate 112 and the remaining part of the doped semiconductor layer 302 forms the doped semiconductor 122 that covers the sloped transition region 104 of the first III-nitride semiconductor 100. The properties of the remaining doped semiconductor 122 shift the conduction band in such a way, that only a single channel 106 is formed near the interface 108 between the buffer and barrier layers 100, 102 along the first sloped transition region 104 of the buffer layer 100 as previously described herein. This way, the device is normally off and has a true transistor transfer characteristic with good threshold voltage control and negligible drain current at sub-threshold gate voltages.

Figure 13G:
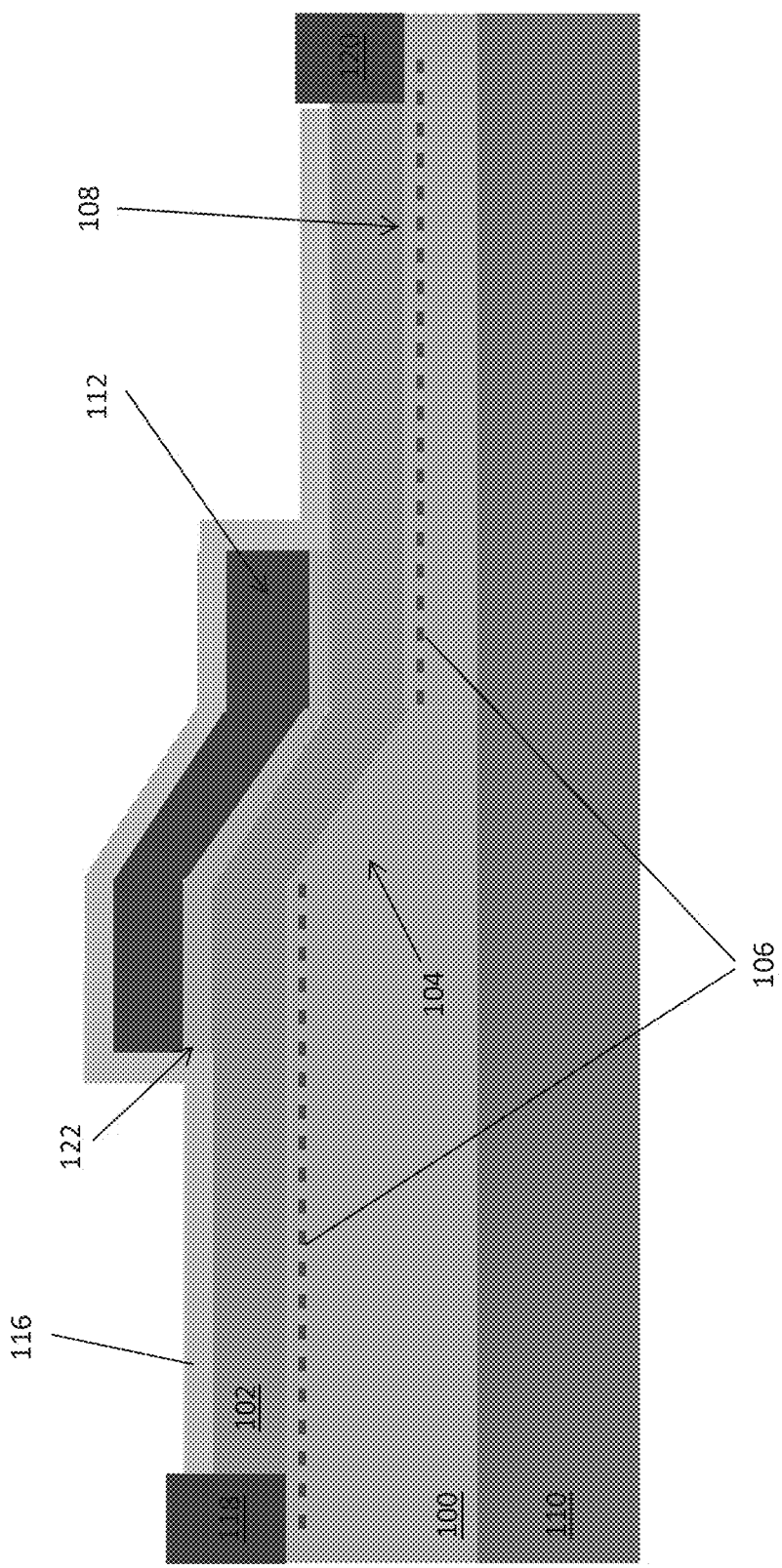

FIG. 13G shows a dielectric passivation 116 deposited on the gate 112 and the barrier layer 102, and source and drain contacts 118, 120 for contacting the channel 106. The contacts 118, 120 can be disposed at the same main side of the device as shown in FIG. 13G so that the device can be contacted at the same side, or one of the contacts 118/120 can be disposed at one main side of the device and the other contact 120/118 can be disposed at the opposite main side so that the device can be contacted at opposite sides.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A normally-off compound semiconductor device, comprising:
    a first III-nitride semiconductor having a first sloped transition region in which the first III-nitride semiconductor transitions at an angle from a first level to a second level different than the first level;
    a second III-nitride semiconductor on the first III-nitride semiconductor and having a different band gap than the first III-nitride semiconductor so that a two-dimensional charge carrier gas arises along an interface between the first and second III-nitride semiconductors;
    a gate; and
    a doped semiconductor over the first sloped transition region and interposed between the gate and the second III-nitride semiconductor,
    wherein the two-dimensional charge carrier gas is disrupted along the first sloped transition region,
    wherein the doped semiconductor does not extend beyond side faces of the gate.

2. The normally-off compound semiconductor device of claim 1, wherein the angle of the transition from the first level to the second level is between +45 degrees and +90degrees or between −45 degrees and −90 degrees so as to disrupt the two-dimensional charge carrier gas along the first sloped transition region.

3. The normally-off compound semiconductor device of claim 1, wherein the first III-nitride semiconductor comprises GaN, the second III-nitride semiconductor comprises AlGaN and the doped semiconductor comprises p-doped GaN.

4. The normally-off compound semiconductor device of claim 1, wherein the first III-nitride semiconductor comprises GaN, the second III-nitride semiconductor comprises AlGaN and the doped semiconductor comprises p-doped AlGaN having lower Al content than the second III-nitride semiconductor.

5. The normally-off compound semiconductor device of claim 1, further comprising a passivation layer on the second III-nitride semiconductor, wherein the gate extends onto a surface of the passivation layer facing away from the second III-nitride semiconductor.

6. The normally-off compound semiconductor device of claim 5, further comprising a source contact and a drain contact spaced apart from one another, and wherein the gate extends onto the surface of the passivation layer in a direction toward the drain contact.

7. The normally-off compound semiconductor device of claim 6, wherein the gate also extends onto the surface of the passivation layer in a direction toward the source contact.

8. The normally-off compound semiconductor device of claim 1, wherein the doped semiconductor covers only part of the first sloped transition region.

9. The normally-off compound semiconductor device of claim 1, wherein the two-dimensional charge carrier gas is not disrupted under the gate outside the first sloped transition region.

10. The normally-off compound semiconductor device of claim 1, wherein a vertical distance between the first and second levels is about 100 nm or less.

11. The normally-off compound semiconductor device of claim 1, wherein the first III-nitride semiconductor has a second sloped transition region in which the first III-nitride semiconductor transitions at an angle from a third level to a fourth level different than the third level, and wherein the doped semiconductor is over the second sloped transition region and interposed between the gate and the second III-nitride semiconductor at a side of the gate opposite the first sloped transition region.

12. The normally-off compound semiconductor device of claim 11, wherein the doped semiconductor extends continuously under the gate from the first sloped transition region to the second sloped transition region.

13. The normally-off compound semiconductor device of claim 11, further comprising a passivation layer on the second III-nitride semiconductor, and wherein a portion of the passivation layer remains under the gate between the first sloped transition region and the second sloped transition region.

14. The normally-off compound semiconductor device of claim 11, wherein the first and the third levels are coplanar, and wherein the second and the fourth levels are coplanar.

15. The normally-off compound semiconductor device of claim 11, further comprising a source contact and a drain contact spaced apart from one another, and wherein the normally-off compound semiconductor device has a threshold voltage above 0.5V for drain voltages up to at least 50V.

16. A normally-off compound semiconductor transistor, comprising:
    a first III-nitride semiconductor having a sloped transition region in which the first III-nitride semiconductor transitions at an angle from a first level to a second level different than the first level;
    a second III-nitride semiconductor on the first III-nitride semiconductor;
    a two-dimensional electron gas along an interface between the first and the second III-nitride semiconductors, the two-dimensional electron gas being disrupted along the sloped transition region;
    a first contact electrically connected to the two-dimensional electron gas;
    a second contact spaced apart from the first contact and electrically connected to the two-dimensional electron gas;

a passivation layer on the second III-nitride semiconductor;

a gate; and a doped semiconductor in place of the passivation layer over the sloped transition region and interposed between the gate and the second III-nitride semiconductor, wherein the doped semiconductor is electrically insulated from the first contact and the second contact by the passivation layer.

17. A normally-off compound semiconductor device, comprising:

a first III-nitride semiconductor having a first sloped transition region in which the first III-nitride semiconductor transitions at an angle from a first level to a second level different than the first level, and a second sloped transition region in which the first III-nitride semiconductor transitions at an angle from a third level to a fourth level different than the third level;

a second III-nitride semiconductor on the first III-nitride semiconductor and having a different band gap than the first III-nitride semiconductor so that a two- dimensional charge carrier gas arises along an interface between the first and second III-nitride semiconductors, the two-dimensional charge carrier gas being disrupted along the first and the second sloped transition regions;

a passivation layer on the second III-nitride semiconductor;

a gate on the passivation layer and over the first and the second sloped transition regions;

a void in the passivation layer in a region under the gate and over the first and the second sloped transition regions; and a doped semiconductor disposed in the void in the passivation layer.

18. The normally-off compound semiconductor device of claim 17, wherein the first and the third levels are coplanar, and wherein the second and the fourth levels are coplanar.

19. The normally-off compound semiconductor device of claim 6, wherein the doped semiconductor is electrically insulated from the source contact and the drain contact by the passivation layer.

20. The normally-off compound semiconductor device of claim 17, further comprising:

a first contact electrically connected to the two-dimensional charge carrier gas; and a second contact spaced apart from the first contact and electrically connected to the two-dimensional charge carrier gas, wherein the doped semiconductor is electrically insulated from the first contact and the second contact by the passivation layer.

* * * * *